United States Patent
Fiedler

(10) Patent No.: US 10,711,349 B2
(45) Date of Patent: Jul. 14, 2020

(54) APPARATUS FOR TREATING AND/OR COATING THE SURFACE OF A SUBSTRATE COMPONENT

(71) Applicant: GUEHRING OHG, Albstadt (DE)

(72) Inventor: Mario Fiedler, Berlin (DE)

(73) Assignee: Guehring KG, Albstadt (DE)

( * ) Notice: Subject to any disclaimer, the term of this patent is extended or adjusted under 35 U.S.C. 154(b) by 675 days.

(21) Appl. No.: 13/854,311

(22) Filed: Apr. 1, 2013

(65) Prior Publication Data

US 2013/0216711 A1    Aug. 22, 2013

Related U.S. Application Data

(63) Continuation of application No. 13/104,394, filed on May 10, 2011, now abandoned, which is a (Continued)

(30) Foreign Application Priority Data

Dec. 15, 2008  (DE) .................. 10 2008 062 332

(51) Int. Cl.
   C23C 16/54    (2006.01)
   C23C 14/56    (2006.01)
   C23C 14/35    (2006.01)

(52) U.S. Cl.
   CPC .............. *C23C 16/54* (2013.01); *C23C 14/35* (2013.01); *C23C 14/56* (2013.01)

(58) Field of Classification Search
   USPC ..................................... 204/298.27
   See application file for complete search history.

(56) References Cited

U.S. PATENT DOCUMENTS 4,485,759 A    12/1984  Brandolf
5,328,583 A  *  7/1994  Kameyama ........... C23C 14/352
                                                 204/192.12
(Continued)

FOREIGN PATENT DOCUMENTS

EP       2 050 837       4/2009
GB       2 303 380       2/1997
WO    2008/013469       1/2008

OTHER PUBLICATIONS

International Search Report dated Apr. 8, 2010 from a corresponding international patent application, 5 pages.

*Primary Examiner* — Karla A Moore
(74) *Attorney, Agent, or Firm* — Burr & Brown, PLLC

(57) ABSTRACT

Apparatus for treating and/or coating the surface of substrate components by deposition from the gas phase. A plurality of substrate carriers and a plurality of coating and/or treating units are arranged in a deposition or treatment chamber which can be evacuated. The system can be equipped in a modular fashion such that the substrate components introduced into the system in a batch can be subjected to different treatments. Method for treating and/or coating the surface of substrate components. The procedure comprises: a) compiling coating and/or treating units and shielding elements from modules in the deposition or treatment chamber; b) equipping the substrate carriers with those substrate components that are to be subjected to the same treatment; c) closing the deposition or treatment chamber; and d) carrying out the individual treatment or coating programs for the substrate components combined in groups on the substrate carriers in one batch.

20 Claims, 5 Drawing Sheets

Related U.S. Application Data continuation of application No. PCT/DE2009/001712, filed on Dec. 4, 2009.

(56) References Cited

U.S. PATENT DOCUMENTS

| | | | |
|---|---|---|---|
| 6,054,029 A | | 4/2000 | Kempf et al. |
| 6,090,248 A | * | 7/2000 | White .................. C23C 14/0078 204/192.12 |
| 6,174,377 B1 | | 1/2001 | Doering et al. |
| 6,315,877 B1 | * | 11/2001 | Goedicke .............. C23C 14/352 204/298.07 |
| 2001/0007244 A1 | * | 7/2001 | Matsuse ............ C23C 16/45519 118/719 |
| 2002/0036065 A1 | | 3/2002 | Yamagishi et al. |
| 2007/0218702 A1 | | 9/2007 | Shimizu et al. |

\* cited by examiner

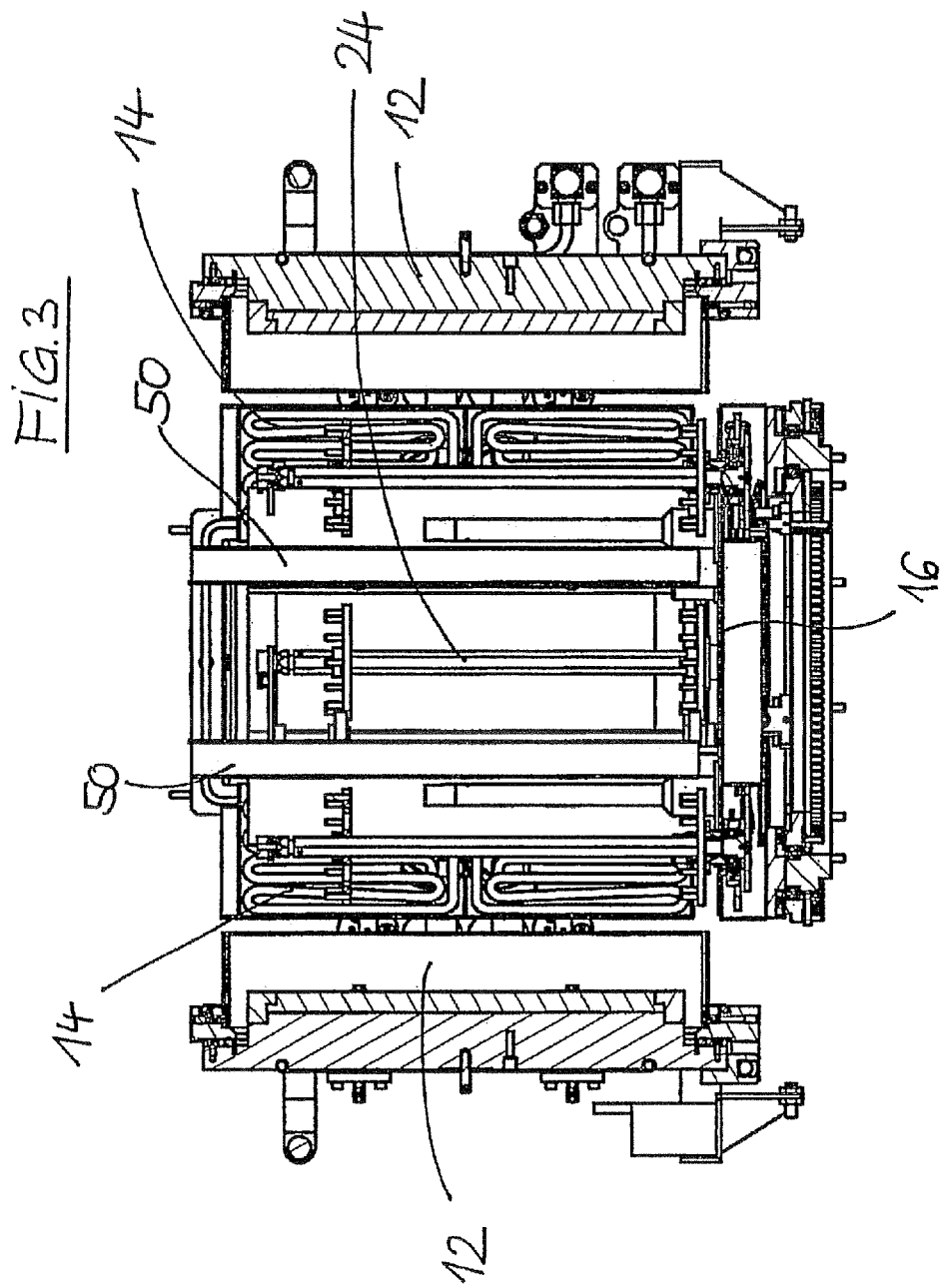

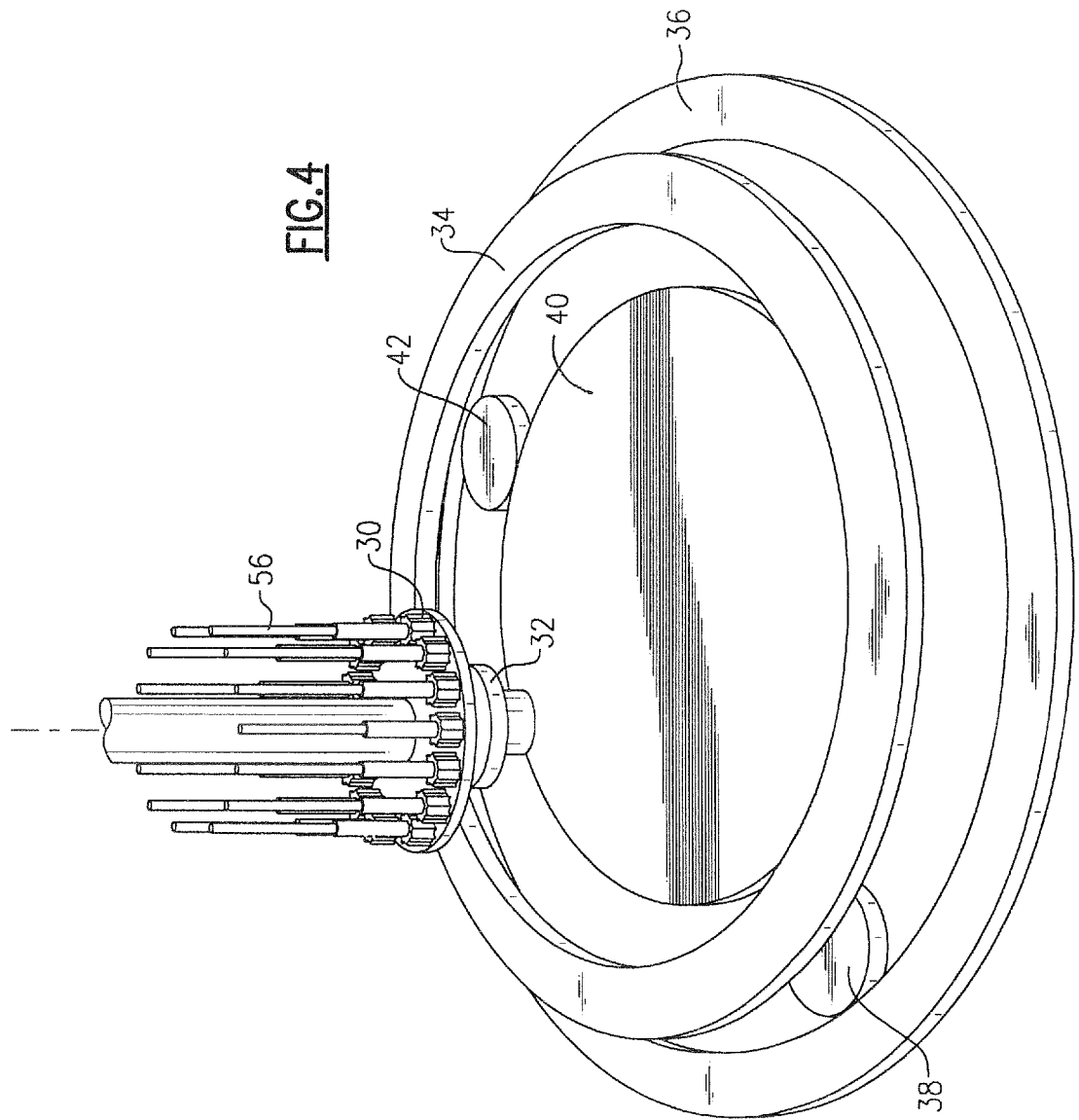

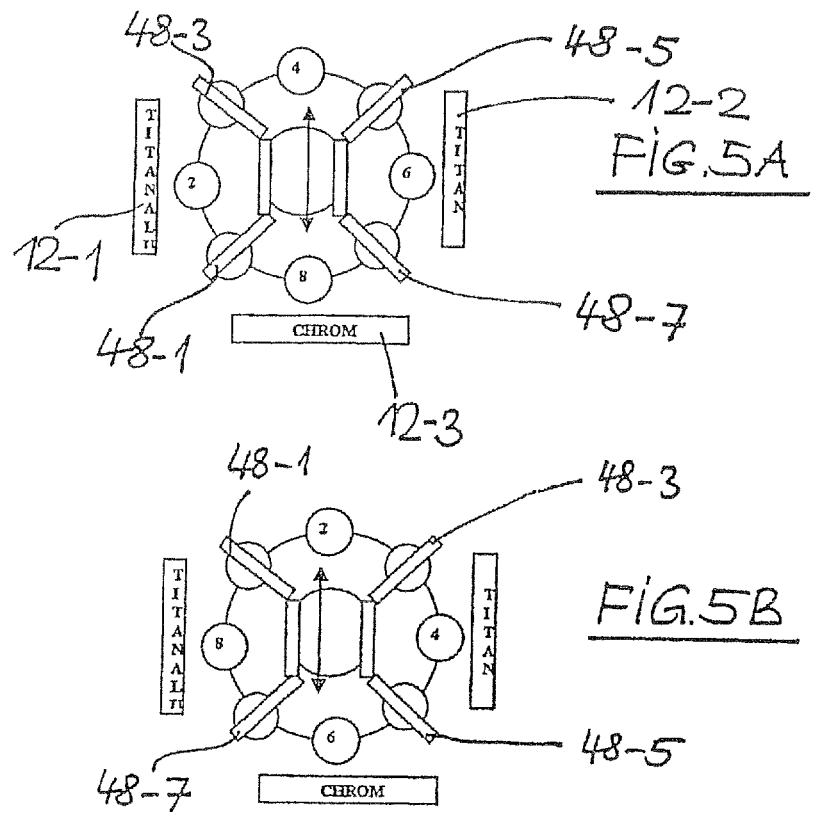
FIG.5A
FIG.5B
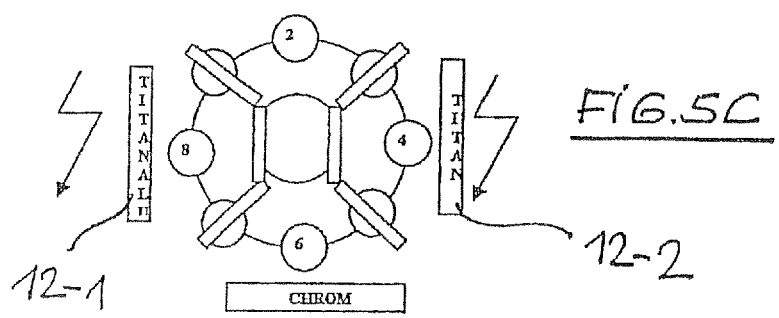
FIG.5C
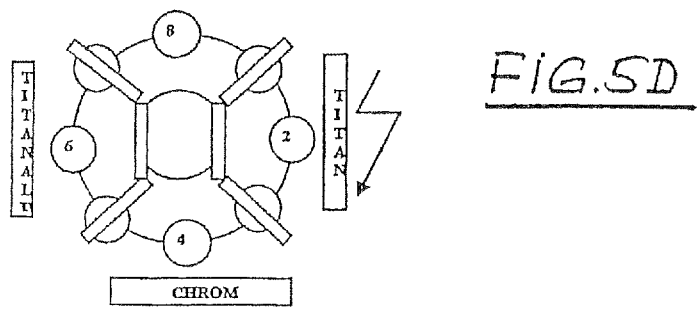
FIG.5D

APPARATUS FOR TREATING AND/OR COATING THE SURFACE OF A SUBSTRATE COMPONENT

CROSS-REFERENCE TO RELATED APPLICATION

This application is a continuation of U.S. patent application Ser. No. 13/104,394, filed May 10, 2011, the entirety of which is incorporated herein by reference.

The invention relates to a device and a method for the surface treatment and/or coating of substrate components by deposition from the gas phase, in particular by physical deposition from the gas phase according to the PVD (physical vapor deposition) or the reactive PVD method, according to the preamble of claim 1 or claim 14, respectively. Using such devices or such methods it is possible to apply very thin coatings, for example, corrosion and wear protection coatings, such as carbide coatings based on titanium, for example, to workpiece surfaces, i.e., to substrate components. Such thin coatings are frequently used in tool production, in particular in the production of machining precision tools, for example, drilling, milling, or reaming tools.

While the CVD (chemical vapor deposition) method operates using comparatively high processing temperatures of 900 to 1100° C., the processing temperatures can be substantially lower in the PVD process, i.e., at approximately 100 to 600° C. According to this method, the coating material is first vaporized by applying a suitable physical effect, for example, by an electron beam, an electric arc (arc PVD), or by sputtering. The vaporized material is then incident on the substrate surface, where it forms layers. In order that the vapor particles reach the substrate, partial vacuum must be used. A linear particle movement occurs in this process, so that the substrate must be moved in order that the entire substrate surface can be coated uniformly and homogeneously.

The lower processing temperatures in the PVD method are purchased at the cost of greater device outlay, however. This is because the substrates to be coated—to achieve good coating adhesion—must be subjected to a careful surface pretreatment and precise process control. In addition, it must be ensured that so-called shadowing effects are compensated for. Therefore, relevant PVD coating facilities must be equipped with a drive technology for the continuous movement of the substrate components during the coating or surface treatment procedure. In addition, because the deposition or vaporization is performed in high vacuum, i.e., in the range from $10^{-4}$ to 10 Pa, i.e., the treatment chamber must be hermetically sealed to the outside, a comparatively complex construction of the coating facility results in this way.

In order to transfer the coating materials, such as metals, into the gas phase, various ways have been proposed according to the PVD method, such as sputtering, including magnetron sputtering, ion plating, including reactive ion plating, or laser vaporization or vacuum vaporization. All methods share the feature that the processing parameters, such as gas atmosphere, temperature, and orientation of the substrate surface to the coating material, must be maintained very precisely to achieve the desired coating or treatment effect. Therefore, typical coating facilities have been constructed so that the treatment chamber offers space for multiple substrate carriers and coating and/or treatment units, such as vaporizer sources, cathodes, targets, magnetrons, etc. Such vacuum treatment facilities are described, for example, in DE 10 2005 050 358 A1 or in DE 10 2006 020 004 A1.

The substrates to be treated and/or coated can only be provided with a single type of coating using such commercially available facilities. Even if this type of coating is a multilayer coating, as described in the document U.S. Pat. No. 6,051,113, for example, for typical coating facilities this means that only one type of coating can always be deposited over the entire batch of the coating facilities, even if the coating thickness can behave differently over the entire batch.

This has the result that typical coating facilities often can only be operated inefficiently. This is because the highest percentage of processing time in the coating and/or treatment facilities described at the beginning according to the PVD method is consumed in heating and cooling the substrates and their holding devices. In addition, because the spectrum of the substrate components to be coated is widespread in many coating centers, different coatings are also required for the different substrate components. Since the volume of the coating facility is fixed because of the dimensions of the coating vessel, and the number of substrates or substrate components which require a specific type of coating is often insufficient to fill up a coating facility 100%, the required delivery times often cannot be maintained.

The invention is therefore based on the object of providing a device for the surface treatment and/or coating of substrate components by deposition from the gas phase, in particular by physical deposition from the gas phase according to the PVD method, and a method for operating such a device, using which it is possible to minimize the processing and delivery times.

This object is achieved with respect to the device by the features of claim 1 and with respect to the method by the method steps of claim 14.

According to the invention, the device is constructed such that it can be equipped with modules, and in such a way that the substrate components introduced in a batch into the coating device can be subjected to different treatments, i.e., a coating or a surface treatment, after the closing of the coating/treatment chamber. Through the design according to the invention of the device, the degree of utilization of the coating facility can be significantly increased and, in addition, the coating facility can be operated substantially more economically and with greatly improved energy efficiency. This is because the larger number of substrate components according to the invention in the coating facility is only to be heated and cooled once, whereby processing time is saved to a significant extent.

The method according to the invention is characterized in its core in that coating and/or treatment units and shielding modules can be assembled according to a desired coating and/or treatment program for different substrate components to be coated, and the substrate carrier can then be equipped with those substrate components which are to be subjected to the same treatment in one batch. After the closing of the treatment chamber, the shielding modules and the process controller of the facility ensure that the substrate components assembled on the individual substrate carriers can be subjected to an individual coating and/or treatment program. According to a refinement of the method, different treatments of the substrate components can even be performed simultaneously at various locations of the coating chamber.

Because of the modular construction of the facility, it is possible to adapt the coating facility extremely flexibly to the respective existing order situation. The additional advantage results that the facility can be operated economically even if only a reduced quantity is charged, in that areas can be provided within the treatment chamber, which can be heated and cooled individually and shielded from other areas of the treatment chamber, and in which a specific coating and/or etching program can be performed under shielding from further areas of the chamber.

Advantageous refinements and variants of the invention are the subject matter of the subclaims.

With the refinement of claim 2, the existing installation space of the treatment chamber is advantageously utilized, the additional advantage resulting that the different treatments of the substrate components can run simultaneously because of the spatial separation of the treatment stations. In addition, the possibility is thus opened up of subjecting different substrate carriers of selected coating and/or treatment units to an individual treatment having precisely monitored processing parameters, without being influenced by adjacent coating and/or treatment units. A very precise and homogeneous growth rate of the coating can thus be achieved.

Through the shielding unit according to claim 3, which is preferably in turn implemented as a module, it is possible to save valuable installation space, because substrate components can be subjected to different treatments even in extremely tight installation space using the shielding modules.

It has been shown that it is readily sufficient for PVD coating facilities to implement the shielding modules in the form of a partition wall configuration according to claim 4, without having to accept a quality reduction of the surface treatment or coating. The partition walls can comprise different materials, including ceramic and/or perforated metal materials.

The flexibility of the facility is additionally increased if, according to claim 5, kinematics are provided, using which the relative location between the substrate carriers and the coating and/or treatment units and/or heating units can be changed when the deposition or treatment chamber is closed.

It is fundamentally possible to provide the coating and/or treatment units with a drive together with the carrier construction. However, the kinematics are simpler if an installation table according to claim 6 is equipped with a rotary drive.

The rotary drive unit for the installation table is advantageously simultaneously used as an indexing unit for positioning selected substrate carriers in relation to selected coating and/or treatment units, whereby the control expenditure becomes less.

According to claim 10, a rotary drive, for example, in the form of a shaft, for a substrate carrier is provided at each installation space of the installation table. It is possible in this way to operate the coating facility in a typical way when it is filled 100% with substrate elements to be coated uniformly, without losing the above-described flexibility of the facility.

Using the modification of claim 11, for example, a selected substrate carrier in direct proximity to a coating and/or treatment unit can be set into rotational movement without actuating the cyclic operation, whereby it is possible to deposit an extremely homogeneous coating which is precisely defined in its thickness on these selected substrate components.

Fundamentally, it is possible to put selected coating and/or treatment units into function successively. The construction according to the invention of the coating facility also allows selected coating and/or treatment units to be operated synchronously, however, whereby further processing time is saved.

Exemplary embodiments of the invention are explained in greater detail hereafter on the basis of schematic drawings. In the figures:

FIG. 1 shows a perspective view of the interior of a coating facility with the coating chamber wall removed;

FIG. 2 schematically shows the top view of the coating facility according to FIG. 1 with closed coating chamber;

FIG. 3 shows a schematic sectional view of the coating facility according to FIG. 2 in section corresponding to III-III in FIG. 2;

FIG. 4 shows a perspective schematic view of selected drive components of the coating facility according to the invention; and FIGS. 5A to 5D show views to illustrate different installation table positions during the performance of the method according to the invention.

The figures schematically show the components received in the interior of a processing chamber (not shown in greater detail) of a coating facility, which is required for coating substrate components according to the PVD method or according to the reactive PVD method. In other words, the assemblies shown in the figures are situated in a coating chamber or vacuum chamber which can be evacuated and is preferably provided with various gas connections. Such vacuum chambers are known, so that a more precise description of this chamber can be dispensed with here. The special feature of the coating facility to be described in greater detail hereafter is how the interior of the deposition or treatment chamber which can be evacuated can be equipped in order to significantly increase the cost-effectiveness during operation of such a facility and minimize the processing times of the facility because of improved flexibility.

For this purpose, a modular construction of the coating device is selected. Coating and/or treatment modules 12 are situated at predetermined angular intervals around an installation table identified by 10. These coating and/or treatment modules 12 are preferably formed by vaporizers or so-called sputter cathodes having targets which can be modularly equipped, additional so-called shutters—not shown in greater detail—being able to be used. Such coating or treatment modules are known per se, so that a more precise description of these components is superfluous here. However, it is to be emphasized that the present invention is not restricted to special treatment/coating modules. Rather, all units regularly used in the coating process according to the PVD method can be employed. In addition to the coating/treatment modules 12, additional heating units 14 are provided, which are typically situated between the treatment modules 12 and can also be implemented as modules.

An etching anode identified by 16 is located in the center of the installation table 10, which works together with a central filament cathode (not shown in greater detail in the figures), which is above the coating modules 12 and heating units 14 in the area of the cupola (not shown) of the coating chamber.

Figure 1:
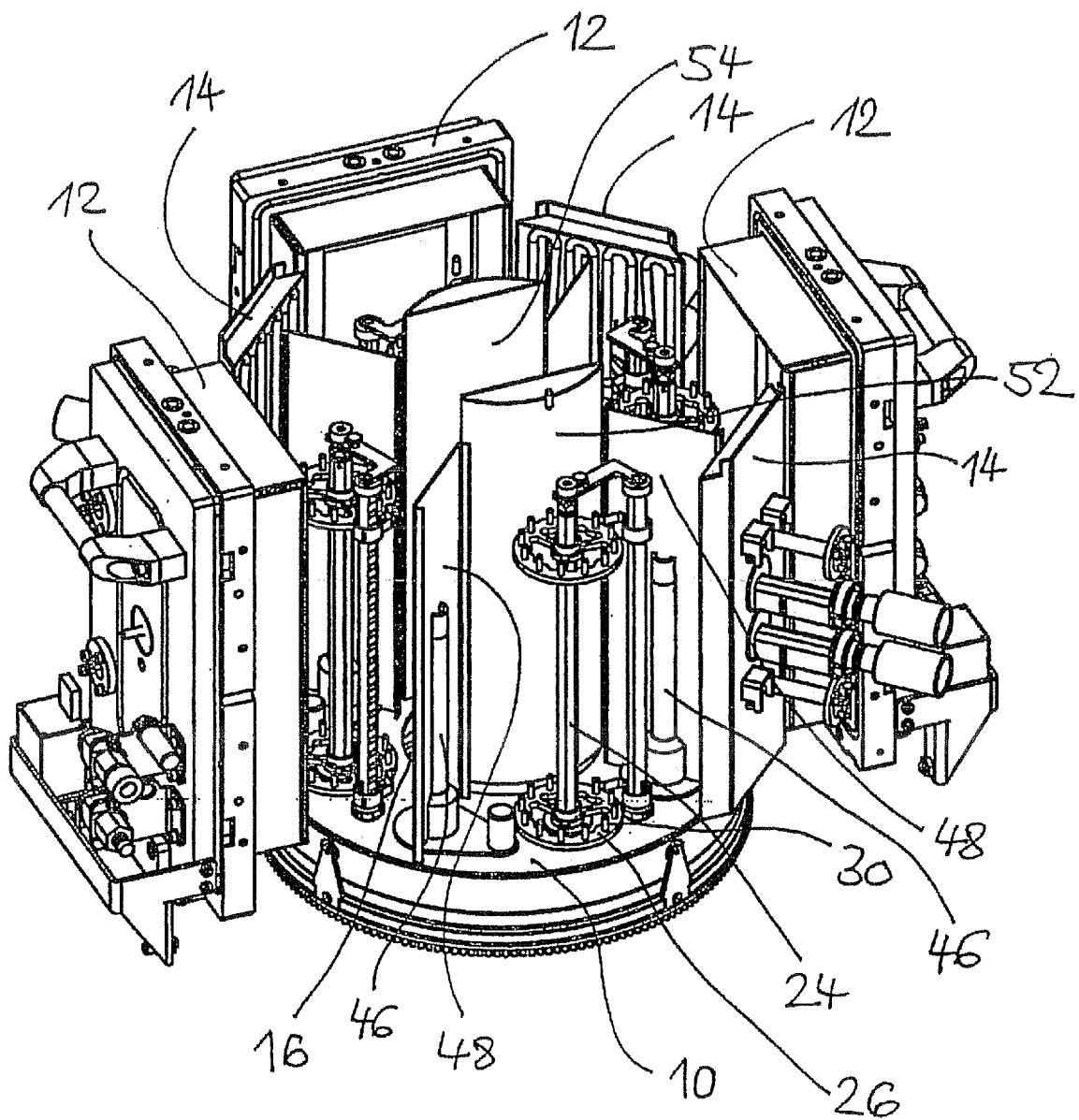
Figure 2:
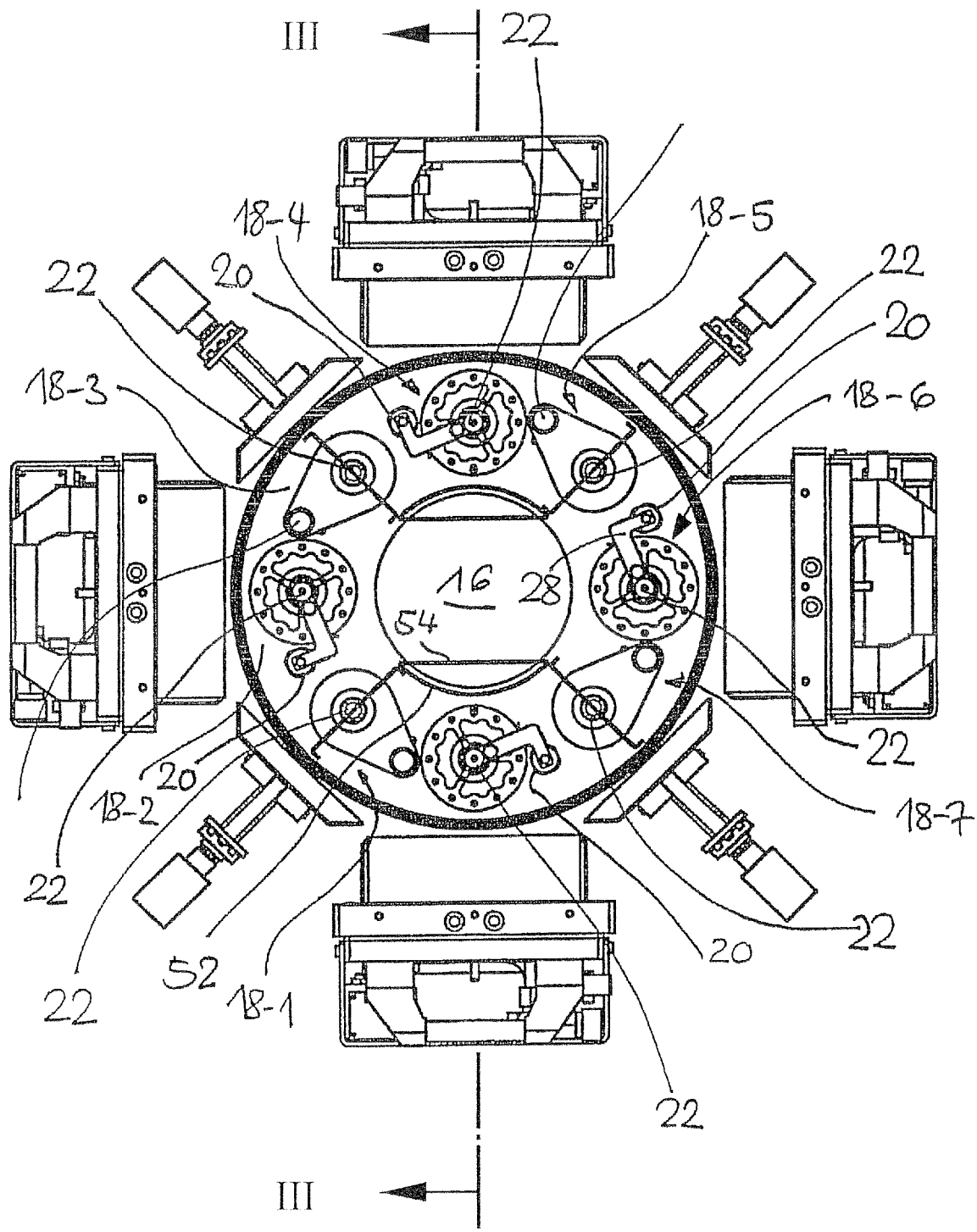

FIG. 1 shows the configuration of the modules required for the coating or treatment when the deposition or treatment chamber is opened, while the configuration is shown when the chamber is closed in the top view according to FIG. 2. This view shows that a part of the coating modules 12 and heating units 14 grouped around the installation table 10 can be installed on a separate part, which is used as a charging door for the vacuum chamber.

The remaining coating and heating modules are installed on a carrier construction, which—like the charging door—has installation points for the flexible configuration of the coating and heating modules.

The installation table 10 is implemented as a type of carousel and carries—as is most obvious from FIG. 2—multiple, i.e., 8 in the exemplary embodiment shown, preferably identically designed installation spaces 18-1 to 18-8, which can be individually equipped with different modules.

A drive shaft 22 is associated with each installation space 18-1 to 18-8, each of which has a vertical rotational axis. In the installation spaces 18-2, 18-4, 18-6, and 18-8, the drive shaft 22 is coupled rotationally fixed to a vertical carrier shaft 24, which carries turntables 26 having plug receptacles 30 holding substrate components, such as drills, at predetermined and preferably 1 settable axial intervals. The plug receptacles are implemented so that the drills protrude from the plug receptacle with the surface sections to be coated or treated.

The carrier shaft 24 is stabilized using a support rod 20 and a support arm 28. It can be ensured via a transmission (not shown in greater detail), that the plug receptacles and therefore also the substrate components execute a separate rotation in identical or opposite directions around the axis of the plug receptacle, which is also vertical, upon rotation of the turntables 26.

FIG. 4 schematically indicates, on the basis of kinematics somewhat altered from the view of FIGS. 1 to 3, how the rotational movement can be transmitted to the installation table 10 and the drive shafts 22. A drive gearwheel 32, which is in mesh engagement with the internal gearing of a first ring gear 34, is located below the installation table 10. The ring gear 34 is connected rotationally fixed to an axially offset second ring gear 36 having a larger diameter, which can be driven via its internal gearing using a first drive pinion 38.

The shaft 22 carrying the drive gearwheel 32 extends rotatably mounted through the installation table 10 and is also seated so it is rotatable in a gearwheel 40 located below the installation table 10, which is drivable via a second drive pinion 42.

Therefore, when the second drive pinion 42 is driven, the gearwheel 40 drives the drive shafts 22 and therefore the installation table 10 in the rotational direction. In this way, the installation table 10 can be cycled.

Simultaneously, the drive gearwheels 32 roll on the internal teeth of the first ring gear 34. Through suitable control of the rotary drive of the first drive pinion 38, the speed of the first ring gear 34 can be kept the same as the speed of the gearwheel 40, so that the drive shafts 22 do not rotate during the cyclic movement of the installation table 10.

In contrast, if the drive of the second drive pinion 42 is stopped and the installation table remains indexed, all drive shafts 22 can be set into rotational movement simultaneously by activating the first drive pinion 38.

Some of the installation spaces, i.e., the installation spaces 18-1, 18-3, 18-5, and 18-7, are equipped differently from the installation spaces 18-2, 18-4, 18-6, and 18-8. They carry a cover plate which has a holder 46 for a radially oriented shielding plate 48 above the covered drive shaft 22. A further, stationary installed shielding wall configuration 50 is provided in each case between the two adjacent shielding plates 48 of the installation spaces 18-1 and 18-7 or 18-3 and 18-5, which is formed in each case by a convex plate 52 and a secant plate 54 and which shields the space between the adjacent radial shielding plate 48 from the adjacent installation spaces. The shielding plates 48 and the shielding wall configurations 50 are also designed as modules and they may be installed—depending on the configuration of the remaining treatment/coating components—at different positions in the interior of the coating chamber.

The following effect results with the above-described construction of the coating facility:

Not only the substrate carriers 26, but rather also the coating and/or treatment units 12, such as the vaporizer sources, cathodes, targets, magnetrons, filament cathode(s), and the etching anode, as well as the heating modules 14, can be assembled modularly and configured in such a way that the substrate components introduced in one batch into the facility can be subjected to different treatments (coating, surface treatment) in the coating and treatment chamber. Specifically, the substrate components, for example, different drills, can be assembled on different substrate carriers which are subjected to different treatments at various locations in the deposition or treatment chamber, at least the substrate components 56 which are situated on a substrate carrier 26 exclusively being kept in the influence area of a very specific coating and/or treatment unit 12 via the shielding plates 48 and the shielding wall configuration 50.

Because, in addition, a drive device is provided, using which the relative location between the substrate carriers 26 and the coating and/or treatment units 12 is changeable with closed deposition and/or treatment chamber, the possibility results of cost-effectively operating the coating facility even if only a few substrate components must be provided with a specific coating or must be subjected to a specific treatment. This is because the coating and/or treatment units 12, such as vaporizers, cathodes, targets, magnetrons, filament cathode, and etching anode, as well as the shielding elements 48, 50, can be assembled from modules in the deposition or treatment chamber according to a desired coating or treatment program for the substrate components, and the substrate carriers 26 can be equipped accordingly with those of substrate components which are to be subjected to the same treatment. Subsequently, the deposition or treatment chamber can be closed, after which the individual treatment or coating programs for the substrate components assembled in groups on the substrate carriers (26) can be run through in one batch. Heating and cooling the substrate components and substrate carriers multiple times can be dispensed with, whereby processing time can be saved to a significant extent and the utilization of the coating facility can be greatly increased even in the case of small batches.

This will be explained on the basis of a treatment example on the basis of FIGS. 5A to 5D:

For example, it is assumed that three different types of coatings are to be applied in one batch. In this case—as shown in FIG. 5A—the positions 1, 3, 5, and 7 are occupied by bulkhead modules 48-1, 48-3, 48-5, and 48-7. Substrates are charged at the positions 2, 4, 6, and 8.

The processing phases of pumping, heating, and cooling are identical for all such carriers, the installation table 10 or the carousel rotates around its axis.

For etching (ion etching), the carousel 10 stops and the substrate carriers 26 at the positions 4 and 8 rotate around their own axis. The etching phase can begin (FIG. 5A).

As soon as the etching for positions 4 and 8 is completed, the drive cycles further and positions 2 and 6 are brought into the etching position (FIG. 5B). Positions 6 and 2 now rotate around their own axis, until the ion bombardment is completed.

When the etching phase has been successfully completed, the coating begins (FIG. 5C). The positions 4 and 8 rotate around their own axis, and the respective right and left vaporizers assigned to these positions having the targets TiAl and Ti are fired, a shutter (not shown in greater detail) being opened—if provided—after burning off is completed (if possible). Position 4—after building up a suitable nitrogen atmosphere—is coated using titanium nitride and position 8 is coated using titanium aluminum nitride. Depending on the achieved coating thickness, the vaporizers are turned off and/or the associated shutters are closed. The drive cycles further into the position according to FIG. 5D.

Positions 2 and 6 can now be coated using a nanolayer. When positions 2 and 6 reach the respective vaporizer required for the next layer, the corresponding vaporizer fires and/or the shutter—if provided—is opened. The respective layer can be deposited. The position then rotates further around its own axis.

Each position can be coated individually or also simultaneously by various vaporizers.

In order to cycle further, the carousel rotates around its own axis. If all coatings have been deposited, the vaporizers are turned off. The entire batch is now cooled, after which the coating or treatment chamber, i.e., the vessel can be ventilated. The process is completed.

This above-described process is only one possible variant. Depending on the number of vaporizers provided and the target materials thereof, the number of positions, and as a function of the construction of the bulkhead modules, various numbers of coating types are possible in one process. The fill level is also directly dependent on the mentioned conditions and thus variable. Shortened processes are also possible through the modular construction. In this case, only a reduced number of positions is charged and these are heated, pretreated, and coated in a targeted manner.

Of course, deviations from the above-described embodiment are possible without leaving the basic idea. Thus, of course, other coatings, for example, decorative coatings can also be deposited.

Instead of the bulkhead modules which can be positioned at the installation spaces, bulkhead units, which are either inserted radially or axially into the interior of the treatment chamber, can also be used, and/or moved and/or oriented.

Furthermore, for example, a kinematic reversal can be performed in the area of the drive for the substrate carriers, so that the installation table remains stationary and the treatment/coating units are driven.

Instead of the etching anode, other functional units can also be used for pretreating the substrate in the coating chamber, the spatial configuration of these functional units also being able to vary in wide limits, for example, because of the process.

Finally, the drive kinematics can also be freely varied to provide the required relative movements between the substrate components and the coating or treatment units. It is solely decisive that the drive is capable of subjecting the installation table, the substrate carriers, and advantageously also the holders for the individual substrate components to a relative rotational movement in relation to the treatment units.

Operation as is possible using typical facilities may also be implemented using the described configuration. This is because all positions carry substrates. However, no bulkhead modules 48, 50 are then installed. All substrates located in the batch are treated comparably in the various processing phases. Only one type of coating is deposited.

A further possibility for operation is that the coating process is shortened in that only selected substrate carriers are equipped and therefore the facility is only charged with a reduced quantity and, during the treatment, only the sector in which a treatment or coating is to be performed is heated.

The invention thus provides a device for the surface treatment and/or coating of substrate components by deposition from the gas phase, in particular by physical deposition from the gas phase according to the PVD (physical vapor deposition) or the reactive PVD method. Multiple substrate carriers and multiple coating and/or treatment units, such as vaporizer sources, cathodes, targets, magnetrons, filament cathode, and etching anode, are situated in a deposition or treatment chamber which can be evacuated for more economic utilization of the facility, it can be equipped modularly in such a way that substrate components introduced in one batch into the facility can be subjected to different treatments (coating, surface treatment).

Furthermore, the invention provides a novel method for the surface treatment and/or coating of substrate components, using which coating facilities according to the PVD (physical vapor deposition) or the reactive PVD method can be operated significantly more cost-effectively. It is characterized by the following method steps:

a) assembling coating and/or treatment units (vaporizers, cathodes, targets, magnetrons, filament cathode, and etching anode) as well as shielding elements from modules in the deposition or treatment chamber corresponding to a desired coating or treatment program for the substrate components;

b) equipping the substrate carriers with the substrate components which are to be subjected to the same treatment;

c) closing the deposition or treatment chamber; and d) running through the individual treatment or coating programs for the substrate components, which are assembled in groups on the substrate carriers, in one batch.

The invention claimed is:

1. A device for supporting substrate components for surface treatment and/or coating of the substrate components by deposition from the gas phase, the device comprising:
    an installation table;
    at least a first substrate carrier, a second substrate carrier and a third substrate carrier, the first and second substrate carriers mounted on a first side of the installation table; and
    at least a first shielding unit on the first side of the installation table,
    the installation table rotatable about an installation table axis,
    the first substrate carrier and the second substrate carrier provided adjacent one another with no intervening substrate carrier provided therebetween in a rotational direction relative to the installation table axis,
    at least a portion of the first shielding unit between the first substrate carrier and the second substrate carrier.

2. A device for the surface treatment and/or coating of substrate components by deposition from the gas phase, the device comprising:
    a deposition or treatment chamber which can be evacuated;
    at least three substrate carriers comprising at least a first substrate carrier, a second substrate carrier and a third substrate carrier in the deposition or treatment chamber;
    an installation table;
    at least two coating and/or treatment units in the deposition or treatment chamber; and
    at least a first shielding unit,
    the installation table rotatable about an installation table axis, the first substrate carrier and the second substrate carrier rotatably mounted on the installation table, the first substrate carrier and the second substrate carrier provided adjacent one another with no intervening substrate carrier provided therebetween in a rotational direction relative to the installation table axis, the first substrate carrier rotatable about a first axis, the first axis extending through the first substrate carrier, the second substrate carrier rotatable about a second axis, the second axis extending through the second substrate carrier, the second axis parallel to the first axis, the first substrate carrier at a first location in the deposition or treatment chamber, the second substrate carrier at a second location in the deposition or treatment chamber, at least a portion of the first shielding unit between the first substrate carrier and the second substrate carrier.

3. The device according to claim 2, wherein the first shielding unit keeps the first substrate carrier in a first influence area within the deposition or treatment chamber, the first influence area exclusive from at least one other influence area within the deposition or treatment chamber.

4. The device according to claim 3, wherein the first shielding unit is mounted on the installation table and is removable from the installation table.

5. The device according to claim 4, wherein the first shielding unit comprises planar components.

6. The device of claim 5, wherein the planar components comprise a partition wall configuration assembled from plates.

7. The device according to claim 4, wherein the first substrate carrier is removable from the installation table.

8. The device according to claim 2, wherein the device further comprises a first drive unit configured to move the first substrate and the second substrate carrier relative to the coating and/or treatment units with the deposition or treatment chamber closed.

9. The device according to claim 8, wherein:
the installation table is in the deposition or treatment chamber,
the installation table has a circumference and a plurality of installation spaces distributed over the circumference,
the device further comprises a drive element in each installation space, and
the substrate carriers are rotatably mounted on the installation table.

10. The device according to claim 9, wherein each installation space is configured to receive a substrate carrier and/or a shielding unit.

11. The device according to claim 9, wherein:
a first drive element is configured to rotate the first substrate carrier about the first axis,
a second drive element is configured to rotate the second substrate carrier about the second axis,
the drive unit is configured to rotate the installation table about a third axis, and
the rotational movement of at least the first substrate carrier is decoupled from the rotational movement of the installation table.

12. The device according to claim 9, wherein the device comprises installation positions for the coating and/or treatment units and/or heating units.

13. The device according to claim 8, wherein the first drive unit comprises a rotary drive.

14. The device according to claim 2, wherein at least selected coating and/or treatment units are operable synchronously.

15. The device of claim 2, wherein coating and/or treatment units comprise at least one unit selected from the group consisting of vaporizer sources, cathodes, targets, magnetrons, heating units, filament cathodes, and etching anodes.

16. A device as recited in claim 2, wherein the at least two coating and/or treatment units are each selected from among coating treatment units and surface treatment units.

17. A device as recited in claim 2, wherein the deposition from the gas phase is by physical deposition from the gas phase according to a physical vapor deposition method or a reactive physical vapor deposition method.

18. A device for the surface treatment and/or coating of substrate components by deposition from the gas phase, the device comprising:
an installation table;
at least two substrate carriers comprising at least a first substrate carrier and a second substrate carrier;
a plurality of shielding plates, comprising at least a first shielding plate and a second shielding plate; and
a shielding wall configuration, comprising at least a first shielding wall,
the installation table rotatable about an installation table axis,
the first substrate carrier and the second substrate carrier on the installation table,
the first substrate carrier rotatable about a first substrate carrier axis, the second substrate carrier rotatable about a second substrate carrier axis,
the installation table axis spaced from the first substrate carrier axis and spaced from the second substrate carrier axis,
the first shielding plate and the second shielding plate on the installation table,
the shielding wall configuration separate from the installation table, so that rotation of the installation table does not cause rotation of the shielding wall configuration,
the installation table, the first and second shielding plates and the shielding wall configuration configured and positioned relative to each other such that the device is movable from a first device arrangement to a second device arrangement by rotating the installation table about the installation table axis,
the first device arrangement an arrangement in which:[1] the first substrate carrier is in a first influence area that is shielded from all other regions of the device, [2] the first influence area is defined in part by structures comprising the first shielding plate, the second shielding plate and the shielding wall configuration, [3] the first shielding plate abuts the shielding wall configuration and [4] the second shielding plate abuts the shielding wall configuration,
the second device arrangement an arrangement in which: [5] the first substrate carrier is in a second influence area that is shielded from all other regions of the device, [6] the second influence area is distinct from the first influence area and is defined in part by structures comprising the first shielding plate, the second shielding plate and the shielding wall configuration, [7] the first shielding plate abuts the shielding wall configuration and [8] the second shielding plate abuts the shielding wall configuration.

19. The device according to claim 18, wherein:
the plurality of shielding plates further comprises at least third and fourth shielding plates,
the installation table and the first and second shielding plates are also configured and positioned relative to each other such that the device is movable from the first device arrangement to a third device arrangement by rotating the installation table about the installation table axis,
the third device arrangement an arrangement in which: [a] the first substrate carrier is in a third influence area that communicates with a fourth influence area, [b] the third and fourth influence areas shielded from all other regions of the device, [c] the third influence area is defined in part by the first shielding plate, the second shielding plate and the shielding wall configuration, [d] the first shielding plate abuts the shielding wall configuration, [e] the second shielding plate abuts the shielding wall configuration, [f] the fourth influence area is defined in part by the third shielding plate, the fourth shielding plate and the shielding wall configuration, [g] the third shielding plate abuts the shielding wall configuration, and [h] the fourth shielding plate abuts the shielding wall configuration.

20. The device according to claim 19, wherein the third and fourth influence areas also communicate with a region that is between the third and fourth influence areas and through which the installation table axis extends.

* * * * *